United States Patent
Callaway, Jr. et al.

[11] Patent Number: 5,838,741
[45] Date of Patent: Nov. 17, 1998

[54] COMMUNICATION DEVICE AND METHOD FOR REDUCING EFFECTS OF NOISE INTRODUCTION BY SYNCHRONIZING DATA TRANSFER TO A RECEIVED SIGNAL

[75] Inventors: Edgar Herbert Callaway, Jr., Boca Raton; Zakir Hussain Ansari; Von Alan Mock, both of Boynton Beach; Eric Thomas Eaton; David Jeffrey Hayes, both of Lake Worth, all of Fla.

[73] Assignee: Motorola, Inc., Schaumburg, Ill.

[21] Appl. No.: 797,324

[22] Filed: Feb. 10, 1997

[51] Int. Cl.$^6$ .............................. H03D 1/04; H03K 5/01; H04B 1/00; H04L 1/00

[52] U.S. Cl. .......................... 375/346; 375/346; 375/344; 375/316; 340/825.44

[58] Field of Search ..................... 375/344, 347, 375/353, 376, 346, 342, 343, 345, 316; 455/260, 226.2, 265, 324; 340/825.44, 825.72

[56] References Cited

U.S. PATENT DOCUMENTS

| | | | |
|---|---|---|---|
| 5,113,416 | 5/1992 | Lindell | 375/344 |
| 5,222,079 | 6/1993 | Rasor | 375/344 |
| 5,455,572 | 10/1995 | Cannon et al. | 340/825.44 |
| 5,612,975 | 3/1997 | Becker et al. | 375/353 |

Primary Examiner—Stephen Chin
Assistant Examiner—Shuwang Liu

[57] ABSTRACT

A communication device (100) having a receiver circuit (110), signal processor circuit (120), controller circuit (130), either embodied by integrated circuits or on a single integrated circuit. The transfer of signals between the circuits is timed so as to minimize the effects of noise introduced into any one of the circuits, particularly the receiver circuit (110). The center of a symbol of a received RF symbol is detected and, through hardware control or software control, the transfer of a data signal generated by the signal processor circuit (120), for example, is permitted to occur only during a period(s) of time determined to have minimal effects on the sampling of a symbol in a received signal by the receiver circuit (110).

12 Claims, 7 Drawing Sheets

COMMUNICATION DEVICE AND METHOD FOR REDUCING EFFECTS OF NOISE INTRODUCTION BY SYNCHRONIZING DATA TRANSFER TO A RECEIVED SIGNAL

FIELD OF THE INVENTION

The present invention relates to managing the transfer of signals between circuit modules on separate integrated circuits, or on a single integrated circuit, of a communication device so as to minimize the effects of noise introduced into the circuits that would otherwise reduce the sensitivity of the communication device.

BACKGROUND OF THE INVENTION

Wireless communication products, such as selective call receivers (pagers), cellular telephones, radios, etc., use multiple integrated circuits (IC's) connected together, or alternatively, one or more denser IC's which include several circuit modules. Whether the circuits are located on separate IC's or on a single IC, one critical concern is to minimize the effect of noise introduced at the communication paths between integrated circuit chips, or circuits within a single integrated circuit.

Noise introduced into a communication device degrades the sensitivity of the device. Noise that is coupled into a radio frequency (RF) receiver circuit or other circuits of the device can affect the demodulated signal output of the RF receiver circuit. The timing of the occurrence of the noise with respect to symbols of a digital RF signal, for example, a frequency shift keyed (FSK) signal, is critical to the effect that the noise has on the demodulated signal. Errors can occur in the symbols of the demodulated signal when noise is superimposed on the received RF signal.

It is desirable to control the timing of transfer of signals between circuit modules of a communication device so as to minimize the effect of noise introduced into the device.

DETAILED DESCRIPTION OF THE DRAWINGS

Figure 1:
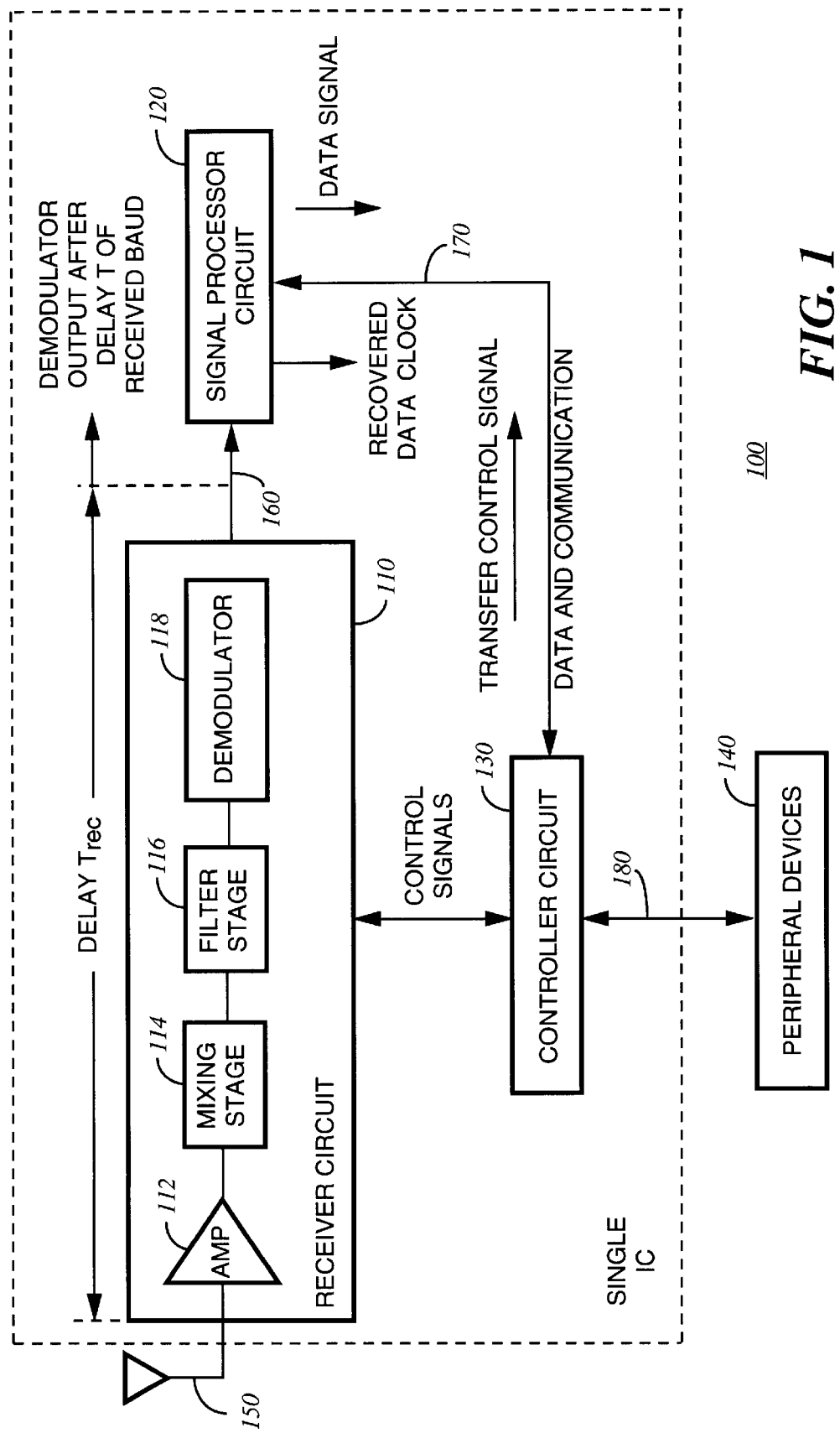
FIG. 1 is a block diagram of a communication device according to the present invention.

FIG. 1 illustrates a communication device 100 comprising a receiver circuit 110, a signal processor circuit 120, a controller circuit 130 and peripheral devices generally shown at 140. An antenna 150 is coupled to the receiver circuit 110 for detecting radio frequency signals. This is a simplistic diagram of a communication device, as those with ordinary skill in the art will appreciate that there are additional components that are also useful in a communication device.

The receiver circuit 110 is one of many types. For purposes of understanding the present invention, it is sufficient to describe the receiver circuit 110 as comprising an amplifier 112, a mixing stage 114, a filter stage 116 and a demodulator 118. In accordance with the present invention, the radio frequency signal received by the receiver circuit is a digital signal that is frequency modulated onto a carrier signal. This signal is ultimately demodulated by the demodulator 118 to generate a multi-level signal, where each level represents a digital symbol. The output of the receiver circuit 110 is a demodulated signal comprised of a sequence of digital symbols. The functions of the receiver circuit 110 are implemented by the analog circuits shown in FIG. 1. Alternatively, it is contemplated that the functions of the receiver circuit 110 be implemented by digital signal processing.

The signal processor circuit 120 processes the demodulated signal output by the receiver circuit, for example, to sample and then decode the demodulated signal in order to recover a data signal encoded in the demodulated signal. For example, the data signal may be encoded in accordance with a signal protocol such as Motorola's FLEX™ paging protocol, a cellular protocol standard, or other protocols used in wireless communication. In order to convey information in the data signal to the user of the communication device 100, through one of the peripheral devices 140, the data signal is transferred to the controller circuit 130.

The controller circuit 130 (or alternatively, the signal processor circuit 120) controls the timing of transfer of signals between the signal processor circuit 120 and it, and between it and the peripheral devices 140. In addition, the controller circuit 130 generates control signals to control certain functions of the receiver circuit 110, such as, ON and OFF times, automatic frequency control, etc.

Figure 2:
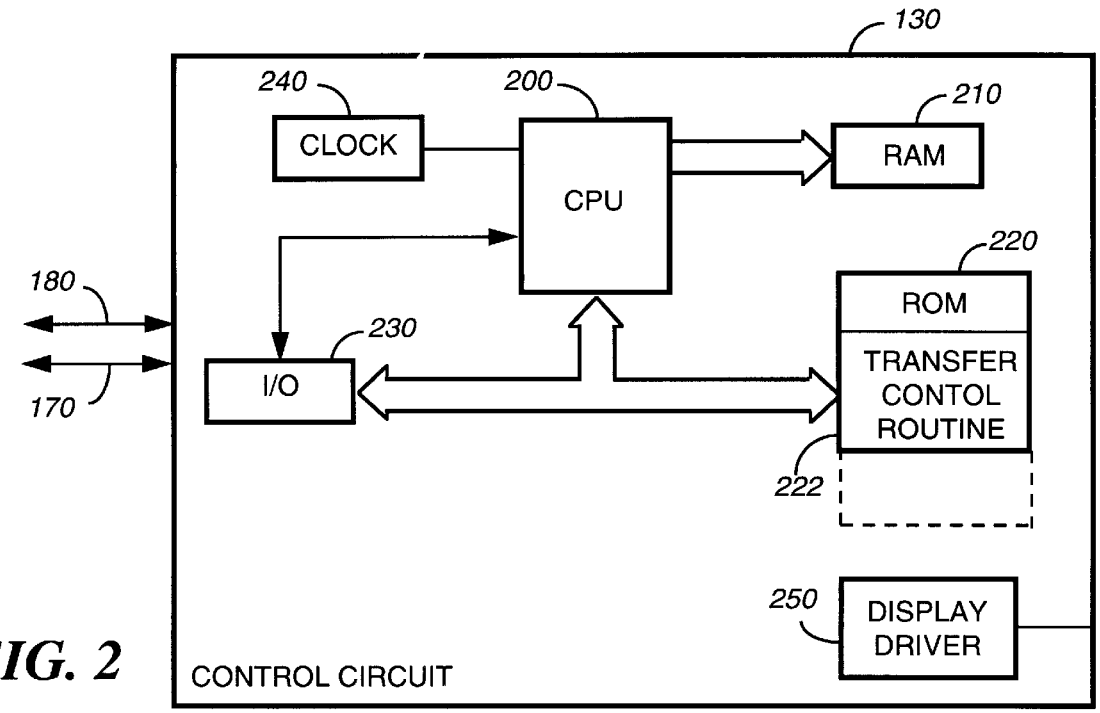
FIG. 2 is a detailed block diagram of a controller in the communication device according to the present invention.

Diverting briefly to FIG. 2, the controller circuit 130 is shown in greater detail. The controller circuit 130 is preferably a microprocessor driven circuit comprising a central processing unit (CPU) 200, a random access memory (RAM) 210, a read only memory (ROM) 220, an input/output (I/O) port 230, a clock 240 and a display driver 250. The CPU 200 executes procedures according to routines stored in ROM 220 (or RAM 210). For example, a transfer control routine 222 is stored in the ROM 220 that the CPU 200 uses to control the timing of the transfer of information between circuits.

In those applications where the communication device is a portable device, such as a selective call receiver (pager), cellular phone, personal data assistant, or a circuit board assembly integrated into other devices, the circuitry shown in FIG. 1 is embodied by separate integrated circuits. Specifically, the receiver circuit 110, signal processor circuit 120, controller circuit 130 and peripheral devices 140 each are separate integrated circuits mounted in relative close proximity on a circuit board. Alternatively, the receiver circuit 110, signal processor circuit 120 and controller circuit 130 are integrated into a single integrated circuit, as shown by the dotted line in FIG. 1. In either case, the receiver circuit 110 is coupled to the signal processor circuit 120 by a communication path 160. The signal processor circuit 120 is coupled to the controller circuit 130 by a communication path 170. Similarly, the controller circuit is coupled to the peripheral devices 140 by a communication path 180.

When it is time to transfer information from one circuit to another, the presence of electrical energy on one of the communication paths can introduce unwanted electrical signals, i.e., noise, onto another of the communication paths or the RF path into the antenna 150, and thus corrupt the operation of that circuit. For example, it is necessary for the signal processor circuit 120 to periodically transfer decoded information in the form of the data signal to the controller. The data signal consists of, for example, a 8, 16 or 32 bit word, and the transfer is, for example, a serial peripheral interface (SPI). When the data signal is transferred, the electrical signal on the communication path 170 may couple to the antenna 150, communication path 160, and communication path 180. The same can be said for the transfer of a signal between the controller circuit 130 and the peripheral devices 140 via communication path 180, and between the receiver circuit 110 and signal processor circuit 120 via communication path 160.

The present invention is particularly concerned with the impact that the transfer of a signal has on the operation of the receiver circuit 110, and the quality of the demodulated signal. It should be appreciated by one with ordinary skill in the art, that corruption of the demodulated signal can lead to errors in the data signal, false baud rate detection, etc., if the transfer coincides with the reception of the portion of the received signal that is to be sampled by the receiver circuit 120. The present invention is concerned with identifying when the portion of the signal to be sampled occurs, whether it be the center of the symbol or some other portion (non-center) in order to minimize effects of noise introduced into the device coincident with symbol sampling. While the foregoing specifically refers to the center of a symbol, it should be appreciated that the present application is applicable to minimizing noise with respect to non-center symbol sampling, and thus is more generally referred to sampling a predetermined portion of a symbol.

In accordance with the first embodiment of the invention, the controller circuit 130 (or alternatively, the signal processor circuit 120) is provided with intelligence to coordinate the transfer of information between the various circuits with the sampling cycle of the receiver circuit 110 or of the signal processor circuit 120. This takes advantage of the large difference generally found between the symbol rate of the RF data (often in thousands of symbols per second) and the symbol rate of microprocessor communication (often in millions of symbols per second). This is particularly useful in modern communication products, where the high symbol rate of microprocessor communication, sent asynchronously with respect to the sampling cycle of the receiver circuit 110, often results in harmonics of sufficient energy to interfere with desired RF signals.

Figure 7:
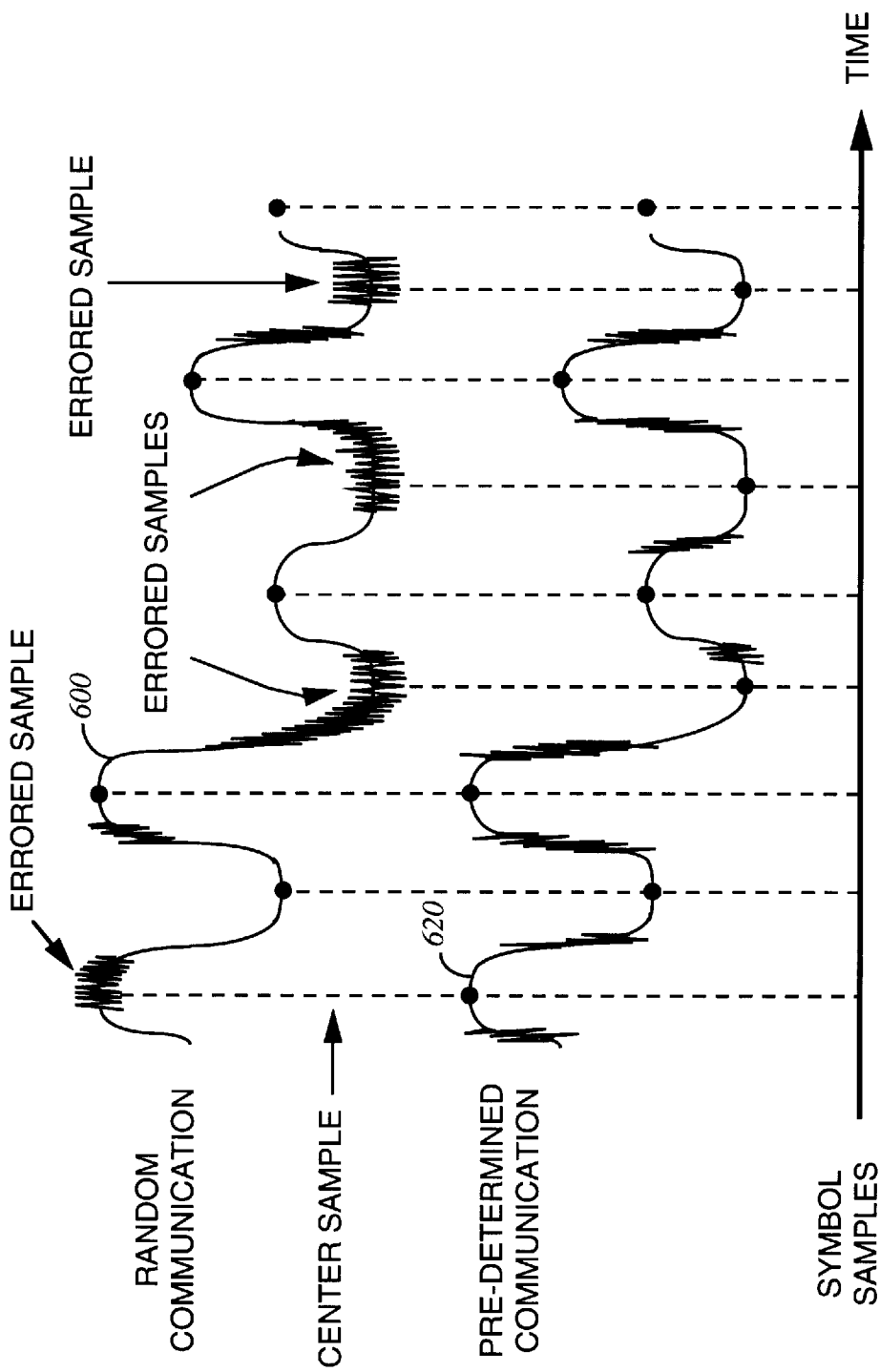
FIG. 7 is a timing diagram of a received radio frequency signal and showing a comparison of random transfer of a data signal with a predetermined transfer according to the present invention.

FIG. 7 is a graphical illustration that highlights the advantages of a synchronized or predetermined communication between circuits over a random communication between circuits. In the upper waveform 600, representative of randomly timed communication or transfer of signals, every time a communication occurs during a symbol center, an error in the recovered data may occur due to the above-described effects on the receiver circuit. Thus, if a random communication coincides with a symbol center, an error in the recovered data is highly likely. On the other hand, as shown in the lower waveform 620, when communication between circuits is confined to predetermined time intervals, not coincident with the symbol centers (or with other predetermined portions of the symbol to be sampled) of the received signal, the occurrence of errors in the recovered data is greatly reduced. The clock rate of the data signal transfer between the signal processor circuit 120 and the controller circuit 130 is much greater than the symbol rate in the received signal. Consequently, the timing constraints for signal transfer placed by the method of the present invention minimizes the effects of noise introduction in the device.

Figure 3:
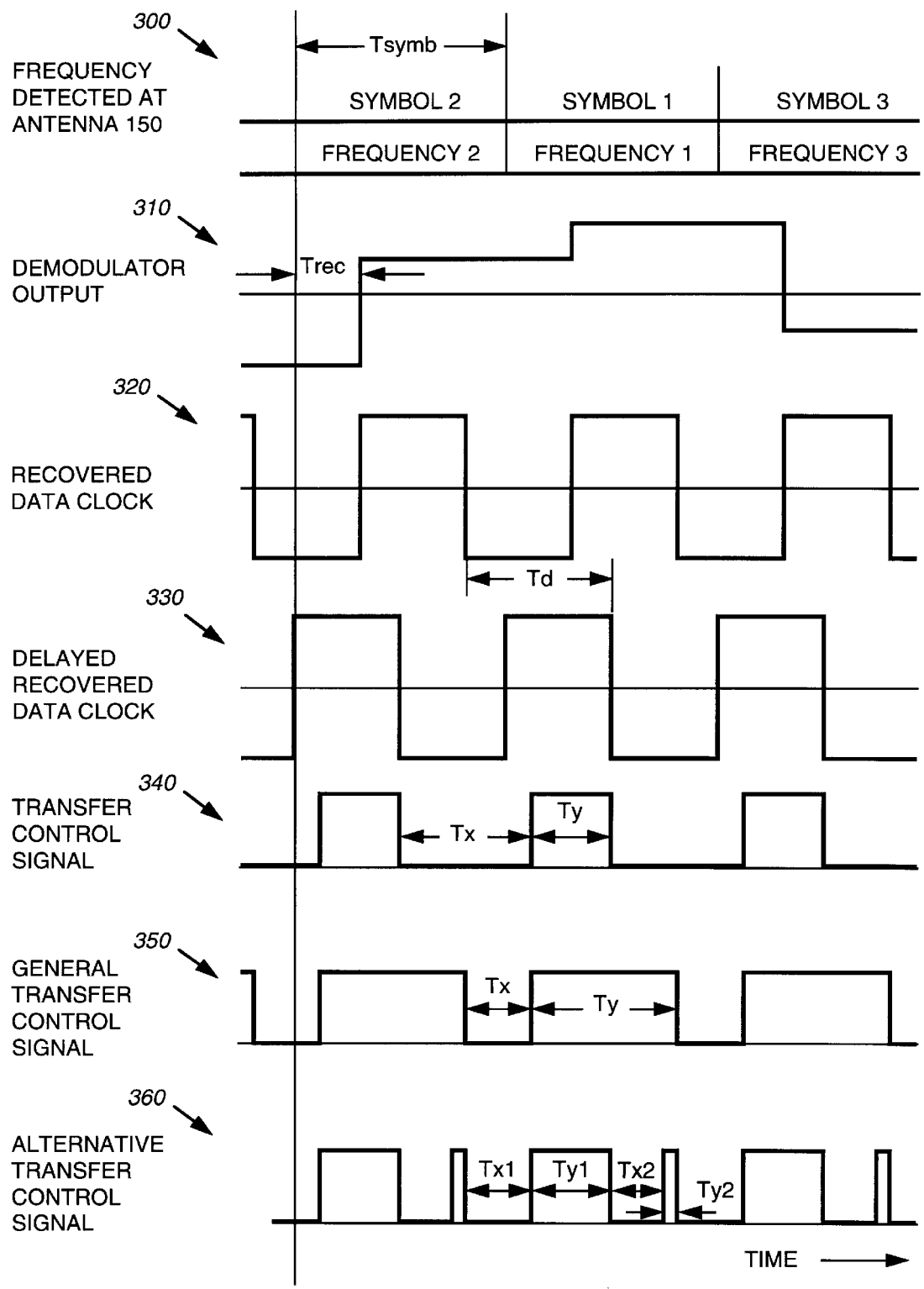
FIG. 3 is a timing diagram of signals in the communication device showing transfer of a data signal according to the present invention.

Returning to FIG. 1, with reference to FIG. 3, an interference "point of entry" is defined as the location in the received signal path of receiver circuit 110 or antenna 150 to which interference (noise) is coupled. Consideration is made of a first condition in which the electrical signal on the communication path 170 couples to antenna 150. In this case, the antenna 150 is the point of entry of the coupled interference into receiver circuit 110. FIG. 3 shows the timing relationship between the frequency of the signal received by receiver circuit 110 and the generation of a transfer control signal. Signal 300 is a representation of the frequency of the received RF signal, wherein frequency 1 corresponds to symbol 1, frequency 2 corresponds to symbol 2, etc., and each symbol has a length Tsymb. Signal 310 is the demodulated signal at the output of the demodulator 118. The demodulated signal 310 which is supplied to the signal processor circuit 120 via communication path 160, for example, has four levels, each level corresponding to a symbol of the received RF signal 300. Thus, each symbol represents two bits of information. Due to the processing required to filter and demodulate the received RF signal 300 in the receiver circuit 110, demodulated signal 310 is delayed in time by Trec, and thus delayed in phase with respect to the RF signal 300, as shown in FIG. 3. That is, the center of a symbol, for example, symbol 1, of the demodulated signal 310, is delayed by a time Trec from the center of the same symbol in the received RF signal 300. Time Trec is considered a group delay of the received signal from antenna 150 through the output of the receiver circuit 110.

Through experimentation it has been determined that the transfer of a signal, which introduces noise into the receiver circuit 110, should be avoided at the time that center of a symbol of the received signal is present at the interference point of entry. This allows the RF signal 300 to be accurately sampled by the receiver circuit 110 (particularly demodulator 118) or signal processor circuit 120. The introduction of noise at or near the center of a received symbol at the interference point of entry can cause the demodulated signal 310 to be falsely above or below a detector threshold level, causing an error in the recovered symbol. Therefore, it is most desirable to avoid the transfer of signals between circuits in the communication device during certain portions of time, corresponding to the time that the center of a symbol of the received signal is at the interference point of entry.

The signal processor circuit 120 generates a recovered data clock signal 320 which is a clock signal having a rate at the expected symbol rate of the signal to be received. The negative-going edge of data clock signal 320 is used as a reference point for generating a delayed data clock signal 330. The delayed data clock signal 330 generated by either signal processor circuit 120 or controller circuit 130 is delayed from data clock signal 320 by a time Td=Tsymb−Trec, and has a negative-going edge at the time that the center of a symbol of the received signal is at the interference point of entry (antenna 150 in this example). Immediately after the negative-going edge of the delayed data clock signal 330, it is possible to transfer signals, for example, on the communication path 170, with little or no effect of noise coupled to the received signal path. This is because the center of the received symbol has passed the interference point of entry, that is antenna 150. Thus, delayed data clock signal 330 is used to determine when the center of a symbol is at the antenna 150 interference point of entry.

To this end, transfer control signal 340 is generated by either signal processor circuit 120 or controller circuit 130. Transfer control signal 340 has a first value for a time Tx, beginning at the negative-going edge of delayed recovered data clock 330, and a second value for a time Ty=Tsymb−Tx. During time Tx communication is allowed on a communication path 170. During time Ty, just prior to the center of a symbol of the received signal arriving at the interference point of entry, communication on communication path 170 is inhibited. Time Ty is provided to allow any filter ringing, charge storage, or other transient effects of the noise injected into the interference point of entry during time Tx to dissipate prior to the arrival of the center of the received symbol. Due to receiver frequency offset and other concerns, filters in receiver filter stage 116 typically have a bandwidth exceeding the matched filter bandwidth of the received signal, thus ensuring that time Ty is less than Tsymb (i.e., that Tx exists).

Those with ordinary skill in the art will recognize that there is often more than one interference point of entry in a receiver. While it is possible to have interference points of entry anywhere within receiver circuit 110 or antenna 150, from the standpoint of the present invention a more general case is that in which the interference points of entry are at both antenna 150 and the output of the demodulator 118. In this case, it is necessary to inhibit communication on communication path 170 when the center of the received symbol is at antenna 150, and when the center of the received symbol is at the output of the demodulator 118. Before each of these instances of time, additional time must be provided in advance, to allow transient effects to dissipate before arrival of the symbol center. The resulting transfer control signal, designated general transfer control signal 350 is shown in FIG. 3. The symbol center is protected through the entire signal path of the receiver circuit 110. The symbol center is thus protected against any additional interference points of entry anywhere in the receiver circuit 110. This is at the cost of a shorter time period Tx, indicating a reduced amount of time permissible for communication on communication path 170.

To further generalize, the time required for transient effects to dissipate depends on the interference point of entry. Typically, there are no significant charge storage or other memory elements associated with the output of the demodulator 118. Therefore, the time required for the transients associated with them to dissipate is very small. Interference injected at antenna 150, on the other hand, must pass through narrow bandwidth channel filters, causing longer transients. Therefore, if time available for communication on communication path 170 is at a premium, it is possible to define an alternative transfer control signal 360. The alternative transfer control signal 360 has two transient settling times Ty1 and Ty2, where Ty1 is associated with the antenna 150 point of entry and Ty2 is associated with the output of the demodulator 118. Since Ty2 is relatively short, a new time Tx2 is created and used for communication on communication path 170. The principle of employing multiple time pairs Tx (Tx1, Tx2) and Ty (Ty1, Ty2) can be extended to two or more interference points of entry anywhere in the received signal path.

Figure 4:
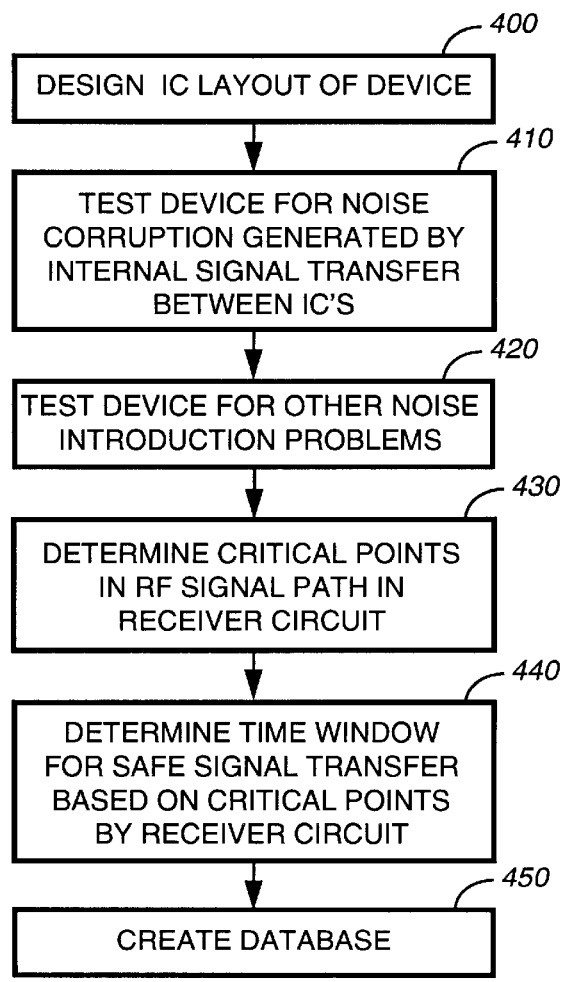
FIG. 4 is a flow chart showing the determination of signal timings in order to properly synchronize transfer of a data signal, according to the present invention.

FIG. 4 depicts the procedure for experimentally determining the delay time Td, time period Tx and time period Ty, for controlling when best to transfer signals between circuits. In step 400, the IC layout of the communication device is designed, with the proximity and interconnection decisions being made. Testing of prototypes of the communication device, with all of the critical IC's in place, is made in step 410 to determine noise corruption into the receiver circuit generated by internal signal transfer between IC's (signal processor circuit to controller circuit, controller circuit to peripheral devices, etc.) by measuring various signals of the IC's. In step 420, testing is made for other noise introduction problems, such as unwanted noise injection into the signal processor circuit or controller circuit, caused by signal transfers.

In step 430, the critical points in the RF signal path are determined by measuring the effects of generated noise on the RF signal at predetermined locations in the receiver circuit 110. The various points in the receiver circuit 110 each contribute to the effects of generated noise in the receiver circuit 110. In step 440, when one or more measured points has been identified to be above a desired threshold, then the delay for the symbol center to pass through one or more of those points is accumulated into the value Tx. In addition, the time for oscillations to subside in the receiver circuit 110 caused by inter circuit communications or other noise sources is added to the value of Tx. The value of Tx and the symbol time (Tsymb) define the time window safe for signal transfer, Ty, where Ty=Tsymb−Tx. A database is updated to store this information for a communication device of a particular design, in order to properly program the communication device with values for Tx, Ty and Td.

The interference points of entry in the RF signal path are determined by measuring noise coupled into the signal path at predetermined locations (e.g., filter stage 116) in the receiver circuit 110. In step 440, when one or more interference point of entry is identified, Trec, the group delay from the first point of entry to the demodulator 118, is determined. This is done empirically, by simulation, or by measurement. The time delay Td=Tsymb−Trec is then calculated. Transient settling time Ty is then determined. While Ty can be predicted, it has been found most practical to employ an experimental approach. The minimum value of Ty that produces the required interference reduction is chosen. Tx is calculated as Tx=Tsymb−Ty. For n interference points of entry, n pairs of Tx and Ty are chosen, which may be employed in the form of alternative transfer control signal 360, or general transfer control signal 350. In step 450 of FIG. 4, a database is updated to store this information for a communication device of a particular design, in order to properly program the device with the correct values of Td, Tx and Ty. The alternative transfer control signal 360 is useful when time available for communication on communication path 170 is at a premium. For situations where such precision is not needed, the general transfer control signal 350 is suitable.

Figure 5:
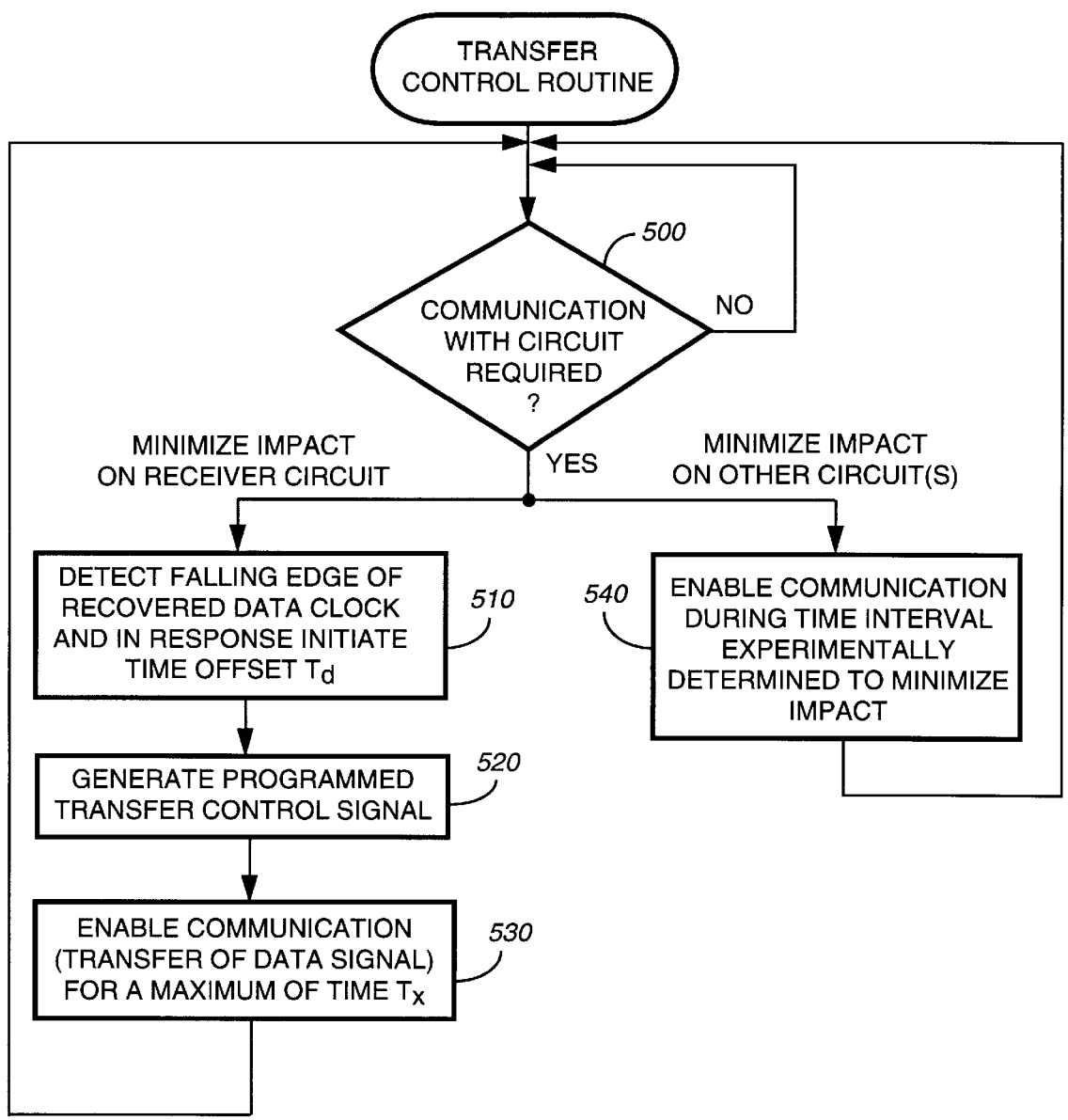
FIG. 5 is a flow chart representing a software program stored in the controller for synchronizing the transfer of a data signal according to a first embodiment of the present invention.

FIG. 5 illustrates the transfer control routine for synchronizing the transfer of signals in the communication device. As explained above, this routine is executed by the controller circuit 130, or alternatively, is executed by the signal processor circuit 120. When communication between circuits is required, such as between the signal processor circuit 120 and the controller circuit 130, an interrupt or other signal is generated in step 500. If the transfer is to be made in such a way as to minimize the impact on the receiver circuit 110, then the left branch is chosen. In step 510, the time delay Td is initiated in response to detecting a negative-going going edge of the recovered data clock signal 320. Thereafter, as represented by steps 520 and 530, the level of the transfer control signal 340 goes low for a time period Tx when communication is enabled, then goes high for time period Ty when communications inhibited.

The right branch of the transfer control routine shown in FIG. 5 is useful to time the transfer of signals with respect to the operation of a circuit other than the receiver circuit 110. For example, through experimental determination, there may be other sensitivity issues with respect to other circuits in the communication device. Thus, in step 540, a signal is generated to initiate transfer during a time interval experimentally determined to minimize impact on those other circuits. An example of such other data signals are infrared signals used to communicate with peripheral devices 140.

Figure 6:
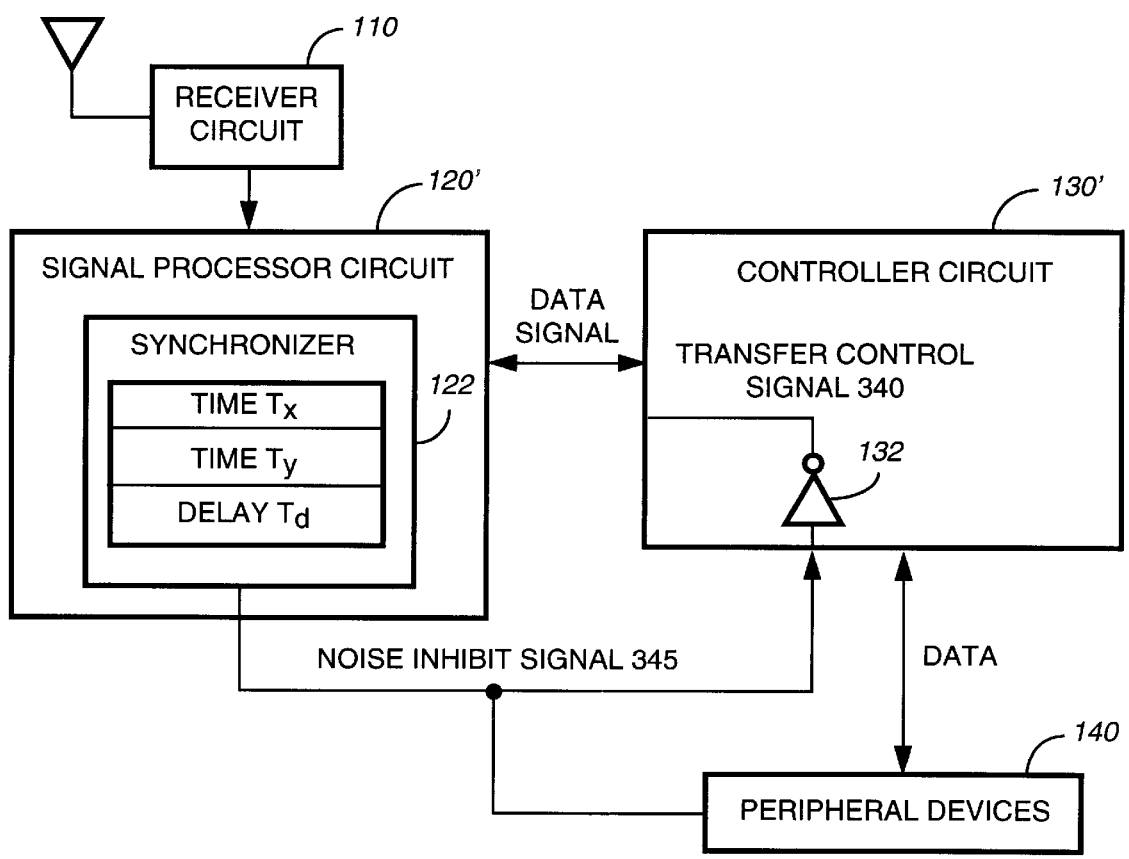
FIG. 6 is a block diagram of a communication device according to a second embodiment of the present invention.

FIG. 6 illustrates a communication device 100' according to a second embodiment of the present invention. In this embodiment, the transfer control signal is responsive to hardware-generated information in the signal processor circuit 120'. The signal processor circuit 120' includes a synchronizer portion 122 that synchronizes to the symbol center of the demodulated signal, and generates a noise inhibit signal 345 based on pre-programmed values for the time Tx, time Ty, and delay Td. The noise inhibit signal 345 is coupled to the controller circuit 130'. The transfer control signal 340 is generated by the controller circuit 130' in response to the noise inhibit signal 345 (by an inverter 132, for example) to enable transfer of signals in the device 100' during time periods when the noise inhibit signal is at a low (or first) level, and otherwise disable transfer of signals during time periods when it is at a high (or second) level. The controller circuit 130' can use the noise inhibit signal to control the transfer of signals from the signal processor circuit 120', as well as between it and the peripheral devices 140. Alternatively, the signal processor circuit 120' can generate the transfer control signal itself.

Figure 8:
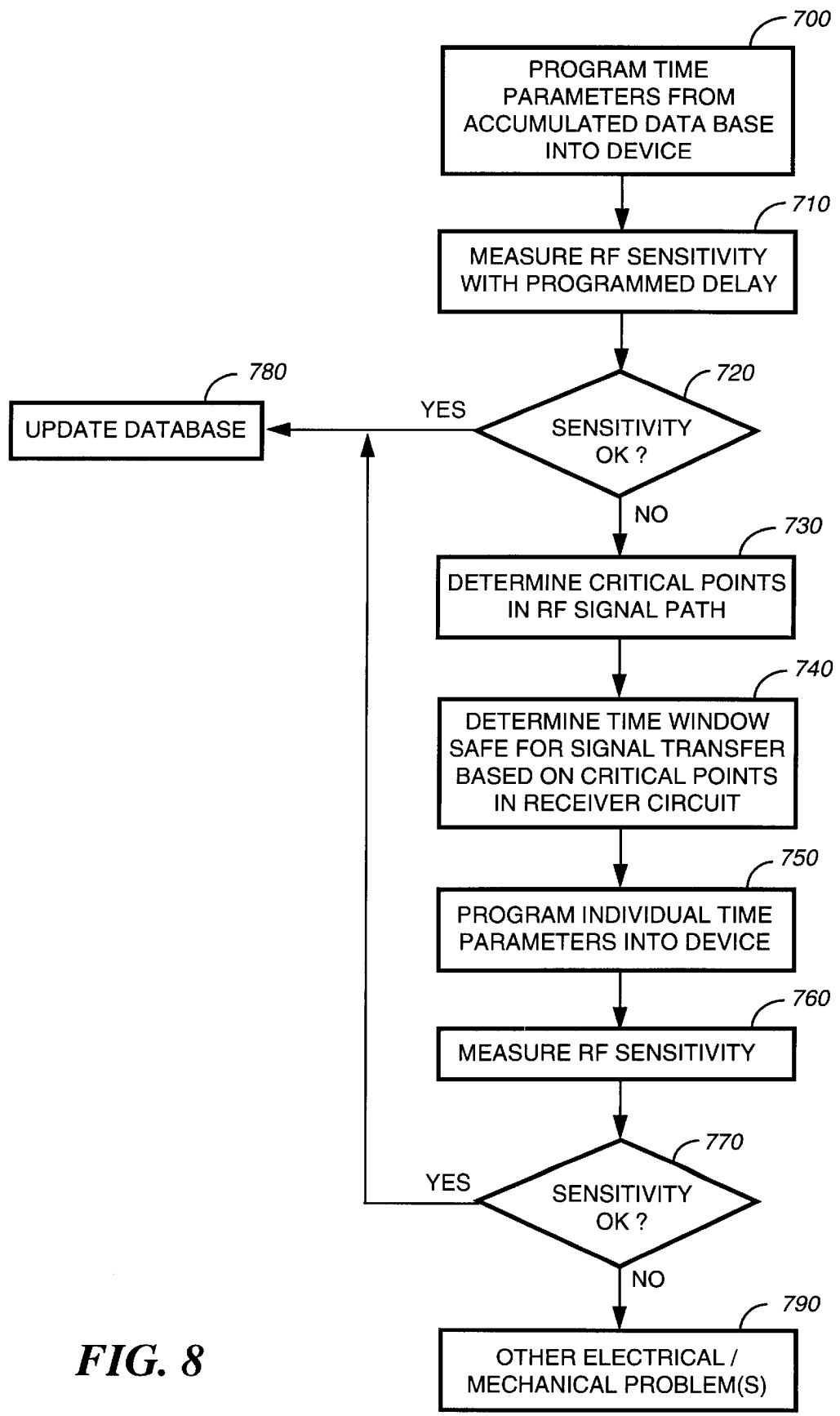
FIG. 8 is a flow chart showing how communication devices are tested and adjusted for variations in parameters at the time of manufacturing, according to the present invention.

FIG. 8 shows the process of programming communication devices with the proper information for the time periods Tx, Ty and Td. In step 700, the data (Tx, Ty and Td) previously determined and accumulated for a communication device (by the procedure shown in FIG. 5) is programmed into a communication device. In step 710, the device is tested for RF sensitivity with the programmed data. The sensitivity is compared with an acceptable threshold in step 720. If the sensitivity threshold is met, the database storing such data is updated in step 780 accordingly to reflect the adequate results. On the other hand, if the sensitivity is not acceptable, then in step 730, the receiver circuit 110 of the particular communication device is tested again to determine the critical points in the receiver circuit 110 as shown in the procedure of FIG. 5. Then, in step 740, the corresponding time delay Td, and time periods Tx and Ty are determined for the particular communication device. The newly determined data for the particular communication device is then programmed into it in step 760. Once again, in step 770, the sensitivity of the device is compared to an acceptable threshold. If the threshold is met, then the database is updated with this new information, to make an indication of such a variation. This new information may be flagged as acceptable alternative data for devices that do not pass the sensitivity threshold with the standard data. If the sensitivity threshold is not met in step 770, then other causes of the problem are determined in step 790.

Thus, the procedure of FIG. 8 allows for making small adjustments to a particular communication device, to account for deviations in sensitivity behavior caused by small differences in components and the manufacturing process.

What is claimed is:

1. A communication device comprising:
    an antenna for detecting a radio frequency signal;
    a receiver circuit coupled to the antenna for receiving the radio frequency signal and generating at an output a demodulated signal therefrom;
    a signal processing circuit having an input coupled to the output of the receiver circuit for processing the demodulated signal to generate at an output a data signal;
    a first electrical communication path coupling the output of the receiver circuit to the input of the signal processing circuit; and
    a controller circuit coupled to the output of the signal processing circuit, the controller circuit generating a transfer control signal to control timing of transfer of signals between the receiver circuit, the signal processing circuit and the controller circuit, by:
        determining when a predetermined portion of a symbol in the radio frequency signal is at an input to the receiver circuit;
        initiating a time delay of a first predetermined period of time upon determining the predetermined portion of a symbol; and
        generating the transfer control signal to enable transfer of the data signal for a second predetermined period of time beginning after the first predetermined period of time.

2. The communication device of claim 1, wherein the controller circuit generates the transfer control signal to control timing of transfer of the data signal from the signal processing circuit to the controller circuit such that the data signal is transferred to the controller circuit during a time window determined to minimize effects of noise introduced into the communication device.

3. The communication device of claim 1, wherein the controller circuit generates the transfer control signal to control timing of transfer of the data signal from the signal processing circuit to the controller circuit with respect to occurrence of symbols of the radio frequency signal.

4. The communication device of claim 1, wherein the controller circuit is programmed in the step of determining to generate a recovered data clock signal at an expected symbol rate of a signal to be received, and the step of initiating comprises generating a delayed data clock signal which is delayed by the first predetermined period of time from the recovered data clock signal, and the step of generating comprises generating the transfer control signal which is at a first value beginning at a negative-going edge of the delayed data clock signal to enable transfer of the data signal and is at a second value to disable transfer of the data signal.

5. The communication device of claim 1, wherein the signal processor circuit comprises a synchronizer circuit for sampling and synchronizing to the demodulated signal generated by the receiver circuit, the synchronizer circuit generating a noise inhibit signal having a first level when noise is determined to have a minimum effect on transfer of signals between circuits of the communication device to enable transfer of signals between circuits, and a second level when noise is determined to have a maximum effect on transfer of signals to thereby disable such transfer of signals.

6. The communication device of claim 1, wherein the receiver circuit, signal processing circuit and controller circuit are separate integrated circuit devices.

7. The communication device of claim 1, wherein the receiver circuit, signal processing circuit and controller circuit are integrated into a single integrated circuit.

8. The communication device of claim 1, wherein the controller circuit is programmed to generate the transfer control signal to account for multiple interference points of entry of the communication device, the transfer control signal comprising time periods determined to be suitable for transfer of signals between circuits of the communication device with respect to each interference point of entry and with respect to a center of a symbol of the radio frequency signal received by the receiver circuit.

9. The communication device of claim 1, and further comprising at least one peripheral circuit coupled to the signal processor circuit and the control circuit, wherein the control circuit controls the transfer of signals between the signal processor circuit and the at least one peripheral circuit so as to minimize effects of noise on the receiver circuit.

10. A method for controlling transfer of signals between circuits, including a receiver circuit that receives a radio frequency signal and generates a demodulated signal, a signal processing circuit that processes the demodulated signal and generates a data signal, and a controller circuit that processes the data signal, the method comprising steps of:

determining a time window when effects of noise introduced into the receiver circuit due to transfer of signals between circuits will be minimized, the step of determining further comprising the substeps of:

determining when a predetermined portion of a symbol in the radio frequency signal is received; and initiating a time delay of a first predetermined period of time upon determining the predetermined portion of a symbol; and generating a transfer control signal to enable transfer of information between the circuits during the time window, the step of generating further comprising the substep of:

generating the transfer control signal to enable transfer of the data signal for a second predetermined period of time beginning after the first predetermined period of time.

11. The method of claim 10, wherein the step of determining comprises determining time periods suitable for transfer of signals between circuits with respect to each interference point of entry and with respect to a center of a symbol of the radio frequency signal received by the receiver circuit.

12. The method of claim 10, wherein the step of determining comprises determining when the center of a symbol in the radio frequency signal is at an input to the receiver circuit.

\* \* \* \* \*